United States Patent
Zhao et al.

(10) Patent No.: US 10,159,160 B2
(45) Date of Patent: Dec. 18, 2018

(54) COMPONENT AND ELECTRONIC DEVICE (71) Applicant: Huawei Technologies Co., Ltd., Shenzhen (CN)

(72) Inventors: Kuibing Zhao, Beijing (CN); Wenping Guo, Beijing (CN); Dong Ma, Beijing (CN); Jinhai Guo, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/741,677

(22) PCT Filed: Jun. 8, 2016

(86) PCT No.: PCT/CN2016/085349
§ 371 (c)(1),
(2) Date: Jan. 3, 2018

(87) PCT Pub. No.: WO2017/210906
PCT Pub. Date: Dec. 14, 2017

(65) Prior Publication Data
US 2018/0199456 A1 Jul. 12, 2018

(51) Int. Cl.
*H05K 7/00* (2006.01)
*H05K 5/00* (2006.01)
(Continued)

(52) U.S. Cl.
CPC .............. *H05K 5/03* (2013.01); *B32B 5/18* (2013.01); *B32B 7/12* (2013.01); *B32B 17/064* (2013.01);
(Continued)

(58) Field of Classification Search
CPC ...................................................... H05K 7/00
See application file for complete search history.

(56) References Cited

U.S. PATENT DOCUMENTS

2015/0071509 A1* 3/2015 Myers ................. G06K 9/0002
382/124
2015/0174320 A1* 6/2015 Grant ................. A61M 39/1011
604/535

FOREIGN PATENT DOCUMENTS

CN          1457068 A       11/2003
CN       201323721 Y       10/2009
(Continued)

OTHER PUBLICATIONS

Foreign Communication From a Counterpart Application, European Application No. 16895736.3, Extended European Search Report dated May 25, 2018, 9 pages.
(Continued)

*Primary Examiner* — Jerry Wu
(74) *Attorney, Agent, or Firm* — Conley Rose, P.C.

(57) ABSTRACT

A component and an electronic device with the component includes a structural assembly and a cover assembly that matches the structural assembly. The structural assembly includes a bracket, the cover assembly includes a cover body, and a glare film is disposed on a surface that is of the cover body and that is close to the structural assembly. An isolation assembly configured to isolate the bracket from the glare film is disposed in some regions between the bracket and the glare film. A hardness of the isolation assembly is less than or equal to hardness of the glare film. A connection assembly configured to connect the bracket and the glare film is disposed in some or all regions that are between the bracket and the glare film and in which the isolation assembly is not disposed.

20 Claims, 8 Drawing Sheets

(51) Int. Cl.
*H05K 5/03* (2006.01)
*G06F 1/16* (2006.01)
*H04M 1/02* (2006.01)
*B32B 5/18* (2006.01)
*B32B 7/12* (2006.01)
*B32B 17/06* (2006.01)
*H05K 5/02* (2006.01)
*G06F 3/041* (2006.01)
*G06K 9/00* (2006.01)

(52) U.S. Cl.
CPC .............. *G06F 1/16* (2013.01); *G06F 1/1601* (2013.01); *G06F 1/1626* (2013.01); *H04M 1/026* (2013.01); *H04M 1/0266* (2013.01); *H05K 5/0217* (2013.01); *H05K 5/0243* (2013.01); *B32B 2255/10* (2013.01); *B32B 2457/208* (2013.01); *G06F 3/041* (2013.01); *G06K 9/00006* (2013.01)

(56) References Cited

FOREIGN PATENT DOCUMENTS

| | | |
|---|---|---|
| CN | 102034633 A | 4/2011 |
| CN | 203838450 U | 9/2014 |
| CN | 105120622 A | 12/2015 |
| JP | 2013258653 A | 12/2013 |
| JP | 2014067916 A | 4/2014 |
| KR | 20060053368 A | 5/2006 |
| WO | 2011084184 A1 | 7/2011 |
| WO | 2011096958 A1 | 8/2011 |

OTHER PUBLICATIONS

Machine Translation and Abstract of Chinese Publication No. CN1457068, Nov. 19, 2003, 6 pages.
Machine Translation and Abstract of Chinese Publication No. CN102034633, Apr. 27, 2011, 13 pages.
Machine Translation and Abstract of Chinese Publication No. CN105120622, Dec. 2, 2015, 18 pages.
Machine Translation and Abstract of Chinese Publication No. CN201323721, Oct. 7, 2009, 7 pages.
Machine Translation and Abstract of Chinese Publication No. CN203838450, Sep. 17, 2014, 5 pages.
Foreign Communication From a Counterpart Application, PCT Application No. PCT/CN2016/085349, English Translation of International Search Report dated Mar. 15, 2017, 2 pages.
Machine Translation and Abstract of Japanese Publication No. JP2013258653, Dec. 26, 2013, 26 pages.
Machine Translation and Abstract of Japanese Publication No. JP2014067916, Apr. 17, 2014, 15 pages.
Machine Translation and Abstract of Korean Publication No. KR20060053368, May 22, 2006, 5 pages.
Foreign Communication From a Counterpart Application, Japanese Application No. 2017-557353, Japanese Notice of Allowance dated Oct. 23, 2018, 3 pages.
Foreign Communication From a Counterpart Application, Japanese Application No. 2017-557353, English Translation of Japanese Notice of Allowance dated Oct. 23, 2018, 1 pages.

* cited by examiner

COMPONENT AND ELECTRONIC DEVICE

CROSS-REFERENCE TO RELATED APPLICATIONS

This application is a national stage application of International Patent Application No. PCT/CN2016/085349, filed on Jun. 8, 2016, which is herein incorporated by reference in its entirety.

TECHNICAL FIELD

The present disclosure relates to the field of electronic device technologies, and in particular, to a component and an electronic device.

BACKGROUND

Figure 1:
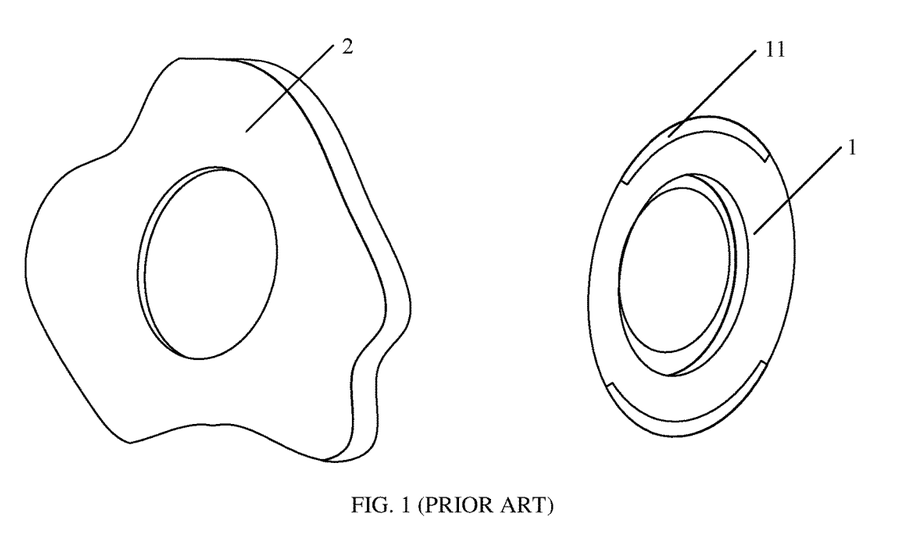
FIG. 1 shows three-dimensional diagrams of assemblies in a component provided in the prior art.

At present, there is a growing number of products with back glass covers on the market, and a back glass cover to which a glare film is attached can enhance a product appearance effect. A back glass cover is usually fastened onto a structural assembly of a product. For example, the structural assembly is a fingerprint recognition integrated assembly, and a schematic structural diagram of the structural assembly and a back glass cover is shown in FIG. 1. A side view of a component formed by fastening together the structural assembly and the back glass cover in FIG. 1 is shown in FIG. 2.

Figure 2:
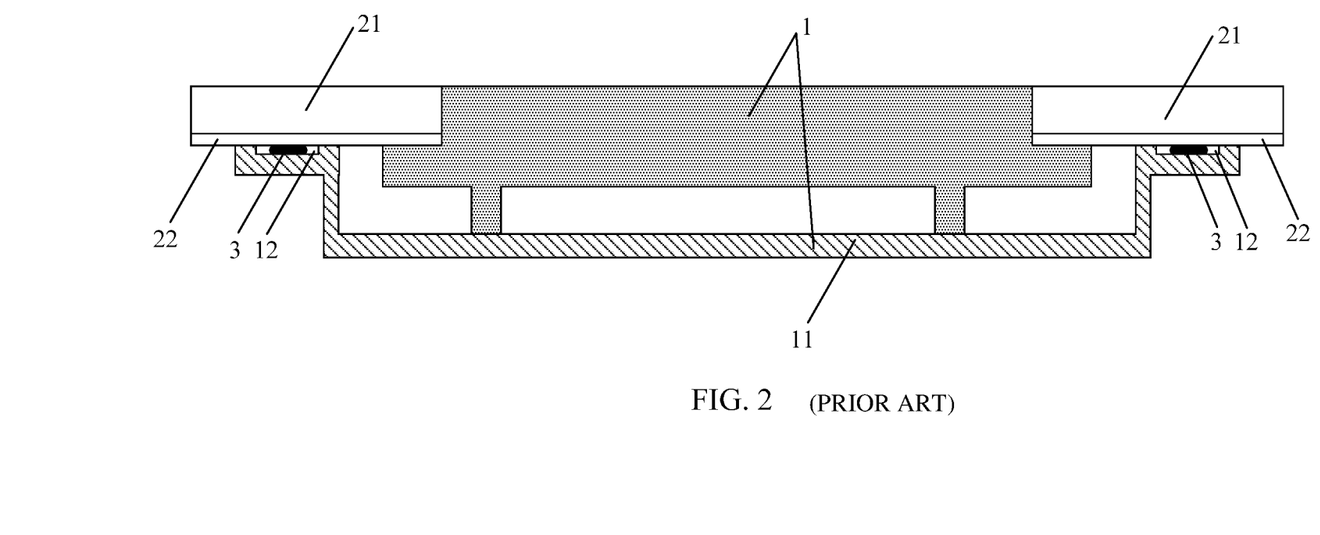
FIG. 2 shows a side view of a component provided in the prior art.

In FIG. 1 and FIG. 2, the component includes a structural assembly 1 (which is shown by a shaded part in FIG. 2), a cover assembly 2, and glue 3. The structural assembly 1 includes a bracket 11. A glue dispensing groove 12 is opened in the bracket 11. The cover assembly 2 includes a cover body 21 and a glare film 22. The glue 3 is dispensed in the glue dispensing groove 12. Processes, such as glue dispensing, press fitting, and pressure retaining, are performed to fasten the bracket 11 and the glare film 22 together, so as to fasten the structural assembly 1 and the cover assembly 2 together. In the component shown in FIG. 2, the bracket 11 is in direct contact with the glare film 22, and the bracket 11 is usually made of a stainless steel material. Therefore, the glare film 22 is easily squeezed in the glue dispensing, press fitting, and pressure retaining processes, causing unrecoverable deformation of the glare film 22 to generate a film mark. This affects an aesthetic appearance.

SUMMARY

Embodiments of the present disclosure provide a component and an electronic device, to reduce a probability that unrecoverable deformation of a glare film in a component occurs, so as to enhance an appearance effect of the component.

To achieve the foregoing objective, the following technical solutions are used in the embodiments of the present disclosure.

According to a first aspect, a component is provided, including a structural assembly and a cover assembly that matches the structural assembly, where the structural assembly includes a bracket, the cover assembly includes a cover body, and a glare film is disposed on a surface that is of the cover body and that is close to the structural assembly; an isolation assembly is disposed in some regions between the bracket and the glare film, where the isolation assembly is configured to isolate the bracket from the glare film, and hardness of the isolation assembly is less than or equal to hardness of the glare film; and a connection assembly is disposed in some or all regions that are between the bracket and the glare film and in which the isolation assembly is not disposed, where the connection assembly is configured to connect the bracket and the glare film.

According to the component provided in an embodiment of the present disclosure, the isolation assembly whose hardness is less than or equal to the hardness of the glare film isolates the bracket from the glare film. Therefore, compared with the prior art, in this embodiment, a probability that unrecoverable deformation of the glare film occurs in glue dispensing, press fitting, and pressure retaining processes can be reduced, and an appearance effect is enhanced. In addition, this can avoid a problem that an appearance effect is relatively poor because a burr or the like on the bracket pierces the glare film in the glue dispensing, press fitting, and pressure retaining processes.

For example, the isolation assembly includes but is not limited to at least one of the following such as a double-sided tape, a high-temperature resistant polyester film sheet, a foam, or the like.

Optionally, a contact area between the isolation assembly and the glare film is greater than or equal to a contact area between the isolation assembly and the bracket. In this case, a width of the bracket can be decreased, and materials can be reduced.

A glue dispensing support member (that is, a glue dispensing spacer) between the structural assembly and the cover body may be implemented according to, but not limited to, the following two implementations.

Optional implementation 1: The isolation assembly is used as the glue dispensing support member. In the optional implementation, no groove may be disposed in the bracket, so as to facilitate processing.

Optional implementation 2: A first groove is disposed in the bracket, the isolation assembly and the glare film form a second groove, and an opening of the first groove is opposite to an opening of the second groove; a protrusion part of the first groove and the isolation assembly are together used as the glue dispensing support member. In the implementation, a bracket in the prior art may be directly used for implementation.

Optionally, the bracket, the glare film, and the isolation assembly form enclosed space, and the connection assembly is disposed in the enclosed space. In this way, when the connection assembly is an object without a fixed shape, such as glue, the connection assembly may be closed in the enclosed space, so as to prevent the object from overflowing. For example, the isolation assembly forms at least two closed loops. The at least two closed loops, the bracket, and the glare film form the enclosed space. Optionally, the isolation assembly forms two closed loops, and the two closed loops are in a double-ring shape. Certainly, a shape of the closed loop is not limited thereto. The shape of the closed loop may be determined according to a factor, such as a shape of the bracket, a shape of the glare film, a glue dispensing position, or processing difficulty.

For example, in specific implementation, the isolation assembly may form only one closed loop, and optionally, the closed loop is in a single-ring shape. In this manner, a glue overflow groove is disposed in an appropriate position on the bracket, and is configured to, when the connection assembly is an object without a fixed shape, such as glue, store glue overflowing in a process of fastening the structural assembly to the cover body by means of glue dispensing.

For example, the structural assembly may include but not limited to any one of the following such as a fingerprint recognition integrated assembly, a front shell mechanical part fastened to a touch panel (TP) by means of glue dispensing, a camera decorating part, a flash decorating part, or the like.

According to a second aspect, an embodiment of the present disclosure provides an electronic device, where the electronic device includes the component provided in the first aspect or any implementation of the first aspect.

DESCRIPTION OF EMBODIMENTS

Figure 3:
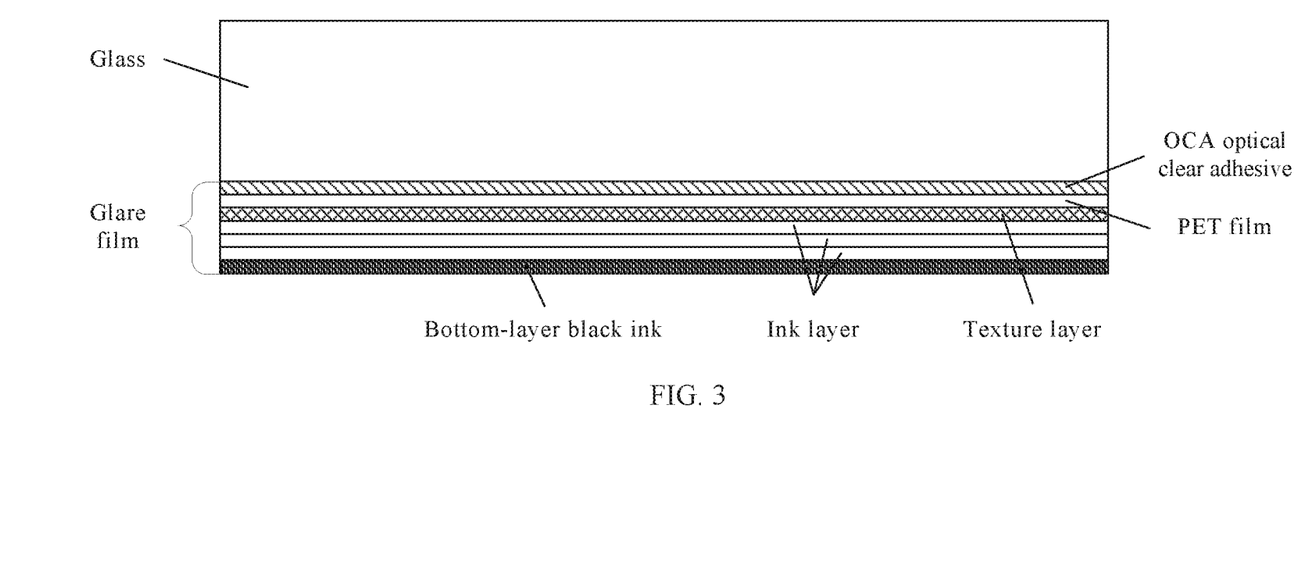
FIG. 3 shows a side view of a glass cover body according to an embodiment of the present disclosure.

A glare film may be formed by an optical clear adhesive (OCA), a Polyethylene Terephthalate (PET) film (such as a high-temperature resistant polyester film sheet), a texture layer, ink layers (generally, three or four layers), bottom-layer black ink, and the like. As shown in FIG. 3, FIG. 3 shows a side view of a cover body provided with a glare film. Overall hardness of the glare film is relatively low. When the glare film is in contact with another mechanical part and is pressed under particular pressure, an undesirable appearance, such as an indentation and a mark, is easily caused. This affects an aesthetic appearance.

As described in the background, the glare film is in direct contact with a bracket, and the bracket is generally made of a stainless steel material. Therefore, in glue dispensing, press fitting, and pressure retaining processes, unrecoverable deformation of the glare film easily occurs, causing a film mark. This affects an aesthetic appearance.

On this basis, the embodiments of the present disclosure provide a component and an electronic device that includes the component. In the component, an isolation assembly is disposed between a glare film and a bracket, so that the glare film is not in direct contact with the bracket. In addition, hardness of the isolation assembly is less than or equal to hardness of the glare film. Therefore, a probability that unrecoverable deformation of the glare film occurs in glue dispensing, press fitting, and pressure retaining processes can be reduced, and an appearance effect of the component is enhanced.

"Multiple" in this application means at least two.

The following clearly describes the technical solutions in the embodiments of the present disclosure with reference to the accompanying drawings in the embodiments of the present disclosure. The described embodiments are merely some but not all of the embodiments of the present disclosure.

Figure 4:
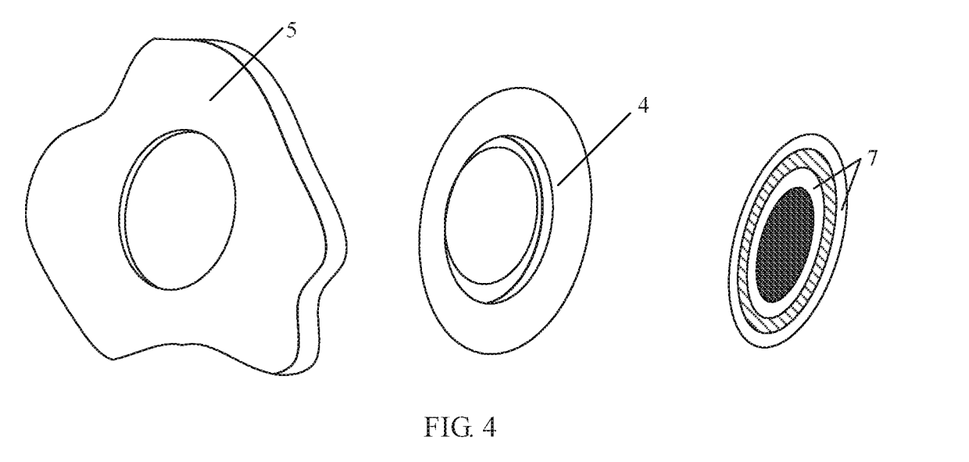
FIG. 4 shows three-dimensional diagrams of assemblies in a component according to an embodiment of the present disclosure.
Figure 5:
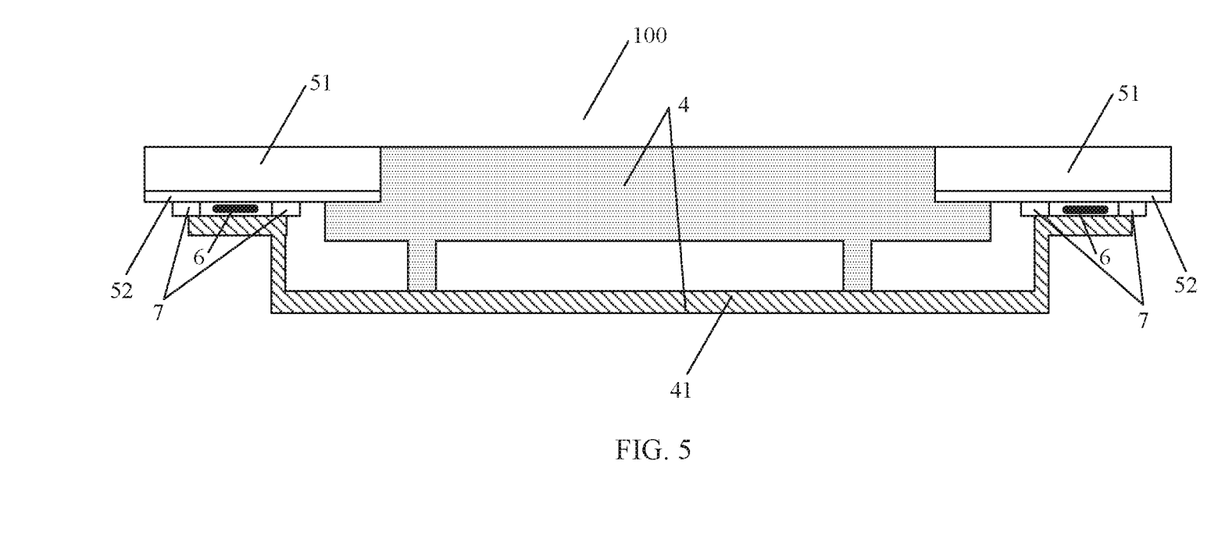
FIG. 5 shows a side view of a component according to an embodiment of the present disclosure.

As shown in FIG. 4, FIG. 4 shows schematic structural diagrams of some assemblies in a component 100 according to an embodiment of the present disclosure. As shown in FIG. 5, FIG. 5 shows a side view of the component 100. The component 100 may include a structural assembly 4 and a cover assembly 5 (FIG. 4) that matches the structural assembly 4. The structural assembly 4 includes a bracket 41. The cover assembly 5 includes a cover body 51. A glare film 52 is disposed on a surface that is of the cover body 51 and that is close to the structural assembly 4. An isolation assembly 7 is disposed in some regions between the bracket 41 and the glare film 52. The isolation assembly 7 is configured to isolate the bracket 41 from the glare film 52. Hardness of the isolation assembly 7 is less than or equal to hardness of the glare film 52. A connection assembly 6 is disposed in some or all regions that are between the bracket 41 and the glare film 52 and in which the isolation assembly 7 is not disposed. The connection assembly 6 is configured to connect the bracket 41 and the glare film 52.

The structural assembly 4 may be any structural assembly that is in an electronic device and that needs to be fastened (for example, fastened by means of glue dispensing) to the cover body 51. For example, the structural assembly 4 may include but not limited to any one of the following such as a fingerprint recognition integrated assembly, a front shell mechanical part fastened to a TP by means of glue dispensing, a camera decorating part, a flash decorating part, or the like. The structural assembly 4 being a fingerprint recognition integrated assembly is used as an example for description below. The bracket 41 may be made of stainless steel, plastic, or the like. This is not limited in this embodiment of the present disclosure.

The cover body 51 may be a back glass cover, a TP glass touch cover, or the like. The glare film 52 is disposed on the surface that is of the cover body 51 and that is close to the structural assembly 4. That is, the glare film 52 is attached onto an inner surface of the cover body 51. For a specific implementation process thereof, refer to the prior art.

The connection assembly 6 may include but not limited to an object used for attaching, such as glue. The connection assembly 6 being glue is used as an example for description below.

The isolation assembly 7 may be understood as an assembly that acts as a support between the bracket 41 and the glare film 52 and is configured to prevent the bracket 41 from being in direct contact with the glare film. In specific implementation, one or more isolation assemblies 7 may be disposed in different positions between the bracket 41 and the glare film 52, and the connection assembly 6 is disposed in another position between the bracket 41 and the glare film 52 (for example, glue is dispensed in the another position between the bracket 41 and the glare film 52). A white double-ring shape in FIG. 4 is a schematic diagram of the isolation assembly 7. A ring shaded part and an oval shaded part in FIG. 4 are empty, indicating that no assembly exists in the parts. Optionally, the isolation assembly 7 may include but not limited to at least one of the following such as a double-sided tape, a high-temperature resistant polyester film sheet (that is, a PET film), a foam, or the like.

In this embodiment of the present disclosure, no limitation is imposed on a position and a size of a region in which the isolation assembly 7 is located and a position and a size of a region in which the connection assembly 6 is located, provided that the isolation assembly 7 supports the bracket 41 and the glare film 52, so as to prevent the bracket 41 from being in direct contact with the glare film 52, and the connection assembly 6 connects the bracket 41 and the glare film 52. For example, the isolation assembly 7 is disposed at the periphery of the connection assembly 6. For example, multiple independent isolation assemblies 7 are disposed at the periphery of the connection assembly 6, a closed isolation assembly 7 is disposed at the periphery of the connection assembly 6, or the like. Preferably, the connection assembly 6 is disposed in enclosed space formed by the isolation assembly 7, the bracket 41, and the glare film 52. For specific descriptions about an implementation, refer to the following content.

According to the component provided in this embodiment of the present disclosure, the isolation assembly whose hardness is less than or equal to the hardness of the glare film isolates the bracket from the glare film. Therefore, compared with the prior art, in this embodiment, a probability that no unrecoverable deformation of the glare film occurs in glue dispensing, press fitting, and pressure retaining processes can be reduced, and an appearance effect is enhanced. In addition, this can avoid a problem that an appearance effect is relatively poor because a burr or the like on the bracket pierces the glare film in the glue dispensing, press fitting, and pressure retaining processes.

Optionally, a contact area between the isolation assembly 7 and the glare film 52 is greater than or equal to a contact area between the isolation assembly 7 and the bracket 41. Because the isolation assembly 7 has relatively low hardness, it needs to be ensured that the isolation assembly 7 has a particular width; otherwise, the isolation assembly 7 is easily torn. Therefore, generally, if a design is made according to this optional implementation, a width of the bracket 41 can be decreased, and materials can be reduced. In FIG. 5, a design is made in this manner.

In actual implementation, to ensure dispensed-glue drawing force, it needs to be ensured that glue used during glue dispensing for fastening has a particular thickness (for example, 0.15 millimeter (mm)). Therefore, a glue dispensing support member (that is, a glue dispensing spacer) needs to be disposed between the bracket and the glare film, and the glue dispensing support member is corresponding to a glue dispensing groove between the bracket and the glare film. Generally, a protrusion part of the glue dispensing groove between the bracket and the glare film is the glue dispensing spacer. In the prior art, as shown in FIG. 2, a protrusion of a glue dispensing groove 12 in a bracket 11 is directly used as a glue dispensing spacer. In this embodiment of the present disclosure, the glue dispensing spacer may be implemented according to, but not limited to, the following two implementations.

Manner 1: The isolation assembly 7 is directly used as the glue dispensing spacer. In this case, the isolation assembly 7 and the glare film 52 form a glue dispensing groove, or the isolation assembly 7 and the bracket 41 form a glue dispensing groove, as shown in FIG. 5. It should be noted that in the manner, a structure of the bracket 41 in FIG. 5 is different from a structure of the bracket 11 in FIG. 2. No glue dispensing groove is opened in the bracket 41, but the isolation assembly 7 and the glare film 52 form the glue dispensing groove, or the isolation assembly 7 and the bracket 41 form the glue dispensing groove. For example, in this manner, a thickness of the isolation assembly 7 may be 0.15 mm.

Figure 6:
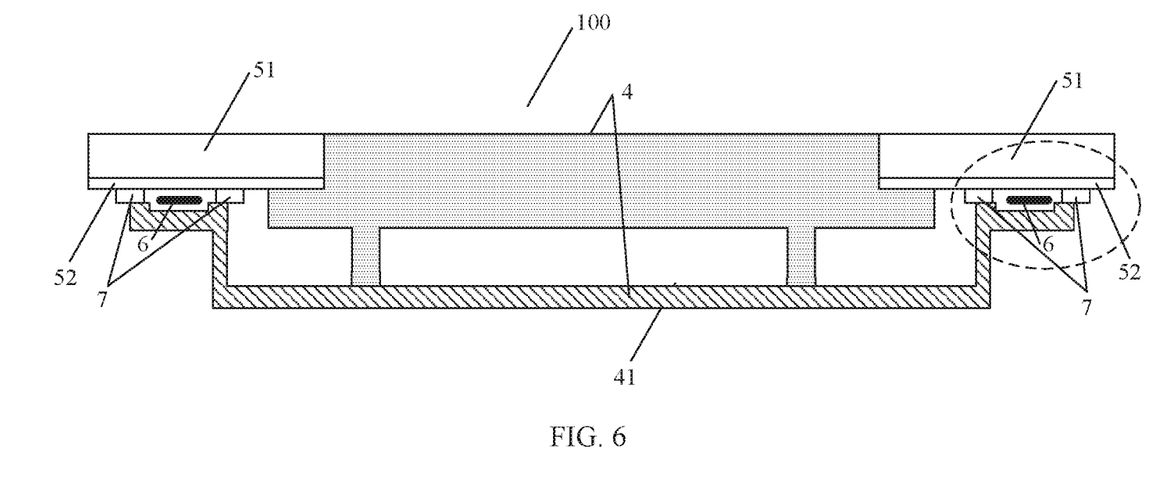
FIG. 6 shows a side view of another component according to an embodiment of the present disclosure.
Figure 7:
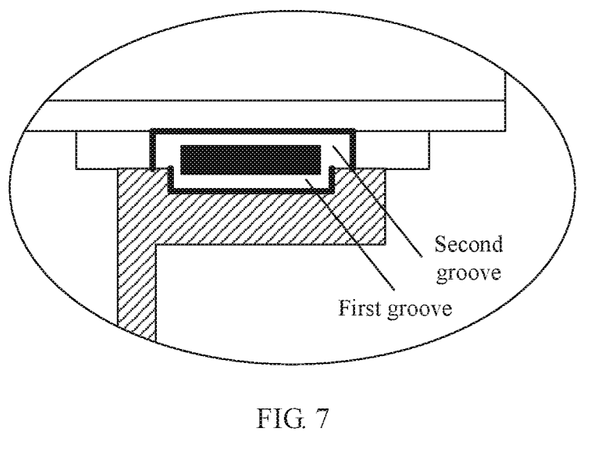
FIG. 7 shows a locally enlarged schematic diagram of the component shown in FIG. 6.

Manner 2: A first groove is disposed in the bracket 41, the isolation assembly 7 and the glare film 52 form a second groove, and an opening of the first groove is opposite to an opening of the second groove. For example, the opening of the first groove is upward, and the opening of the second groove is downward, as shown in FIG. 7. In this case, a protrusion part of the first groove and the isolation assembly 7 are together used as the glue dispensing support member. FIG. 7 is an enlarged schematic diagram of a dashed line part in FIG. 6. In this case, the first groove may be considered as the glue dispensing groove 12 that is opened in the bracket 11 in FIG. 2, or a groove whose depth is less than a depth of the glue dispensing groove 12 that is opened in the bracket 11 in FIG. 2. In this case, the first groove and the second groove form a glue dispensing groove (that is, the glue dispensing groove between the bracket 41 and the glare film 52), and the second groove is a groove formed by the isolation assembly 7 and glare film 52. The opening of the first groove is disposed opposite to the opening of the second groove, forming a large groove (that is, the glue dispensing groove). It should be noted that this manner may be considered as directly adding the isolation assembly 7 between the bracket 11 and a glare film 22 in FIG. 2 without changing a structure of the bracket 11 in FIG. 2 (that is, a structure of the bracket 41 in FIG. 5 is the same as the structure of the bracket 11 in FIG. 2). For example, in this manner, a height of the isolation assembly 7 and the protrusion part of the first groove may be 0.15 mm.

It should be noted that in specific implementation, for ease of fabrication, the glue dispensing groove is preferably designed in Manner 1.

Optionally, the connection assembly 6 is disposed in the enclosed space formed by the bracket 41, the glare film 52, and the isolation assembly 7. In this way, when the connection assembly 6 is an object without a fixed shape, such as glue, the connection assembly 6 may be closed in the enclosed space, so as to prevent the object from overflowing.

For example, the isolation assembly 7 forms at least two closed loops. The at least two closed loops, the bracket 41, and the glare film 52 form the enclosed space. In this embodiment of the present disclosure, a shape of the closed loop is not limited. The shape of the closed loop may be determined according to a factor, such as shapes of the bracket 41 and the glare film 52, a glue dispensing position, or processing difficulty. For example, the closed loop may be in a regular shape, such as a circle, an oval, or a square, or may be in various irregular shapes. It should be noted that because the isolation assembly 7 has a particular width, it can be considered that the closed loop is in a ring shape formed by a regular shape, such as a circle, an oval, or a square, or is in a ring shape formed by various irregular shapes. Optionally, the at least two closed loops are in a double-ring shape, as shown in FIG. 4.

For example, the isolation assembly 7 may alternatively be in a single-ring shape. In this case, the isolation assembly 7 can form only one closed loop. Therefore, no glue dispensing groove can be formed. Optionally, one or more glue overflow grooves may be disposed in an appropriate position on the bracket 41, so as to store glue overflowing in a process of fastening the structural assembly 4 to the cover body 51 by means of glue dispensing.

Figure 8:
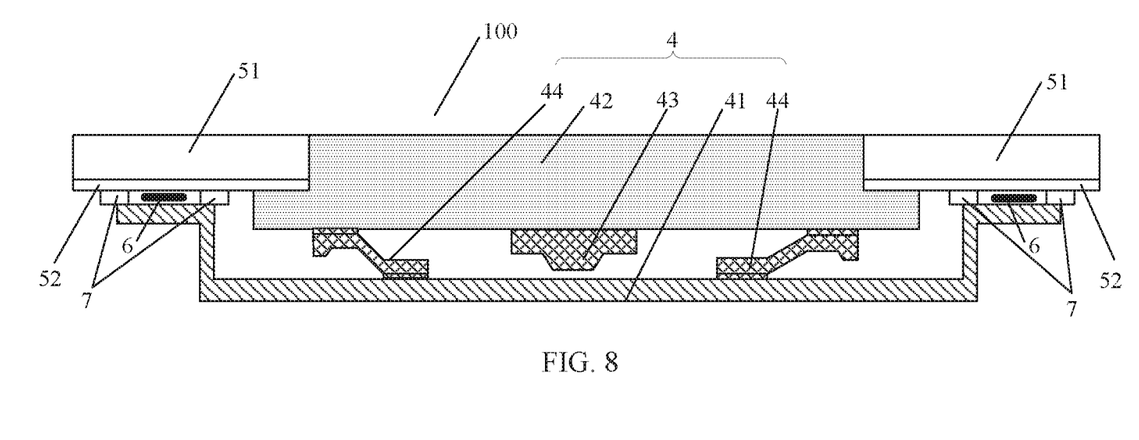
FIG. 8 shows a side view of another component according to an embodiment of the present disclosure.

It should be noted that in the component 100 that needs to implement a button function, the structural assembly 4 being a fingerprint recognition integrated assembly is used as an example for description. As shown in FIG. 8, the structural assembly 4 may further include a structural body 42, and a button member 43 and an elastic fastener 44 that are disposed between the bracket 41 and the structural body 42. When receiving pressing force, the button member 43 moves, so that an internal circuit of the structural assembly 4 is triggered, and the button function is implemented. The button member 43 is fixedly connected onto a lower surface of the structural body 42. The elastic fastener 44 is disposed between the bracket 41 and the structural body 42. The elastic fastener 44 surrounds the button member 43, and the elastic fastener 44 elastically connects the bracket 41 and the structural body 42. There is a gap between the button member 43 and the bracket 41. When the structural body 42 is pressed, the elastic fastener 44 is deformed, and the gap is narrowed, so that the button member 43 is in contact with the bracket 41. FIG. 8 is drawn based on FIG. 5.

For example, the elastic fastener 44 surrounds the button member 43. Specifically, the elastic fastener 44 is centered around the button member 43 and is centrosymmetrically distributed at the periphery of the button member 43. The elastic fastener 44 may be of a ring-shaped integrated structure, and the button member 43 is disposed at the center of the elastic fastener 44. The elastic fastener 44 may alternatively include multiple elastic members, and the multiple elastic members are centered around the button member 43 and are centrosymmetrically distributed at the periphery of the button member 43. In this case, there may be three, four, or more elastic members, provided that the elastic members are symmetrically distributed at the periphery of the button member 43 to ensure that a bottom part of the button member 43 is evenly supported.

An assembly method of any component 100 provided above is not limited in this embodiment of the present disclosure, for example, in principle, provided that the assembly method can be used for assembling the component 100 shown in FIG. 5. It should be noted that in the optional implementation in which the contact area between the isolation assembly 7 and the glare film 52 is greater than the contact area between the isolation assembly 7 and the bracket 41, for ease of operation, generally, the isolation assembly 7 is attached onto the glare film 52 first, then, glue is coated in an appropriate position on the bracket 41 or the glare film 52 (that is, the connection assembly 6 is added between the bracket 41 and the glare film 52); and finally, the isolation assembly 7 is attached to the bracket 41. A position that is on the glare film 52 and to which the isolation assembly 7 is attached may be determined according to a position in which glue dispensing for fastening is performed in actual implementation.

An embodiment of the present disclosure further provides an electronic device, and the electronic device includes any component 100 provided above. For beneficial effects that can be achieved by the electronic device, refer to beneficial effects that can be achieved by the component 100 in the above content, and details are not repeated herein.

Finally, it should be noted that the foregoing embodiments are merely intended for describing the technical solutions of the present disclosure but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present disclosure.

What is claimed is:
1. A component, comprising:
a structural assembly comprising a bracket; and
a cover assembly coextensive with and coupled to the structural assembly and flush with a top surface of the cover assembly, wherein the cover assembly comprises:
a cover body; and
a glare film disposed on a bottom surface of the cover body and disposed close to the structural assembly;
an isolation assembly disposed in some regions between the bracket and the glare film, wherein the isolation assembly is configured to isolate the bracket from the glare film, and wherein a hardness of the isolation assembly is less than or equal to a hardness of the glare film; and
a connection assembly disposed in an enclosed space formed by the isolation assembly between the bracket and the glare film, wherein the connection assembly is configured to connect the bracket and the glare film.

2. The component according to claim 1, wherein the isolation assembly comprises at least one of a double-sided tape, a high-temperature resistant polyester film sheet, and a foam.

3. The component according to claim 1, wherein a contact area between the isolation assembly and the glare film is greater than or equal to a contact area between the isolation assembly and the bracket.

4. The component according to claim 1, wherein the isolation assembly is configured as a glue dispensing support member.

5. The component according to claim 1, wherein the bracket comprises a first groove, wherein the isolation assembly and the glare film form a second groove, wherein an opening of the first groove is opposite to an opening of the second groove, and wherein a protrusion part of the first groove and the isolation assembly are configured together as a glue dispensing support member.

6. The component according to claim 1, wherein the glare film and the isolation assembly form an enclosed space, and wherein the connection assembly is disposed in the enclosed space.

7. The component according to claim 6, wherein the isolation assembly forms at least two closed loops, and wherein the at least two closed loops, the bracket, and the glare film in combination define the enclosed space.

8. The component according to claim 7, wherein the at least two closed loops are configured in a shape of a double-ring.

9. The component according to claim 1, wherein the structural assembly comprises any one of a fingerprint recognition integrated assembly, a front shell mechanical part coupled to a touch panel, a camera decorating part, or a flash decorating part.

10. An electronic device, comprising:
a component, comprising:
a structural assembly comprising a bracket; and
a cover assembly coextensive with and coupled to the structural assembly and flush with a top surface of the cover assembly, wherein the cover assembly comprises:
a cover body; and
a glare film disposed on a bottom surface of the cover body and disposed close to the structural assembly;
an isolation assembly disposed in some regions between the bracket and the glare film, wherein the isolation assembly is configured to isolate the bracket from the glare film, and wherein a hardness of the isolation assembly is less than or equal to a hardness of the glare film; and a connection assembly disposed in an enclosed space formed by the isolation assembly between the bracket and the glare film, wherein the connection assembly is configured to connect the bracket and the glare film.

11. The electronic device, according to claim 10, wherein the isolation assembly comprises at least one of a double-sided tape, a high-temperature resistant polyester film sheet, and a foam.

12. The electronic device, according to claim 10, wherein a contact area between the isolation assembly and the glare film is greater than or equal to a contact area between the isolation assembly and the bracket.

13. The electronic device, according to claim 10, wherein the isolation assembly is configured as a glue dispensing support member.

14. The electronic device, according to claim 10, wherein the bracket comprises a first groove, wherein the isolation assembly and the glare film form a second groove, wherein an opening of the first groove is opposite to an opening of the second groove, and wherein a protrusion part of the first groove and the isolation assembly are configured together as a glue dispensing support member.

15. The electronic device, according to claim 10, wherein the glare film and the isolation assembly form an enclosed space, and wherein the connection assembly is disposed in the enclosed space.

16. The electronic device, according to claim 15, wherein the isolation assembly forms at least two closed loops, and wherein the at least two closed loops, the bracket, and the glare film in combination define the enclosed space.

17. The electronic device, according to claim 16, wherein the at least two closed loops are configured in a double-ring shape.

18. The electronic device, according to claim 10, wherein the structural assembly comprises any one of a fingerprint recognition integrated assembly, a front shell mechanical part fastened to a touch panel, a camera decorating part, or a flash decorating part.

19. The component according to claim 2, wherein a contact area between the isolation assembly and the glare film is greater than or equal to a contact area between the isolation assembly and the bracket.

20. The electronic device according to claim 10, wherein a contact area between the isolation assembly and the glare film is greater than or equal to a contact area between the isolation assembly and the bracket.

\* \* \* \* \*